United States Patent
Rostamy et al.

(10) Patent No.: US 6,771,721 B1
(45) Date of Patent: Aug. 3, 2004

(54) METHOD AND APPARATUS FOR ELIMINATING AUDIO CLICKS IN A RADIO RECEIVER

(75) Inventors: Jafar Rostamy, Solna (SE); Aref Darvish, Sundbyberg (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 08/879,887

(22) Filed: Jun. 20, 1997

(51) Int. Cl.[7] .......................... H04B 1/10; H04L 27/22
(52) U.S. Cl. ................... 375/346; 375/329; 329/304
(58) Field of Search ............................ 375/279, 281, 375/284, 285, 329, 334, 346; 329/304, 318, 349; 381/94.1; 704/226, 233

(56) References Cited

U.S. PATENT DOCUMENTS

| | | | | |
|---|---|---|---|---|
| 3,899,740 A | * | 8/1975 | Unkauf et al. ............... 455/303 |
| 4,328,587 A | * | 5/1982 | Mizuno et al. .............. 375/344 |
| 4,726,069 A | * | 2/1988 | Stevenson ..................... 455/46 |
| 4,792,991 A | | 12/1988 | Eness |
| 4,893,347 A | | 1/1990 | Eastmond et al. |
| 4,893,349 A | | 1/1990 | Eastmond et al. |
| 5,016,019 A | * | 5/1991 | Hawkes ...................... 342/400 |
| 5,187,809 A | * | 2/1993 | Rich et al. ................. 455/33.1 |
| 5,396,618 A | * | 3/1995 | Fukui et al. ............ 370/241 X |
| 5,442,655 A | | 8/1995 | Dedic et al. |
| 5,646,964 A | * | 7/1997 | Ushirokawa et al. ....... 375/346 |
| 5,771,224 A | * | 6/1998 | Seki et al. .................. 370/206 |
| 6,195,399 B1 | * | 2/2001 | Dent et al. .................. 375/322 |

* cited by examiner

Primary Examiner—Young T. Tse

(57) ABSTRACT

A radio receiver improves audio quality by eliminating the audio clicks caused by fading conditions. The receiver detects the presence of the fading condition based on a large phase variation of a faded received signal during a time interval. When a fading condition is detected, the radio receiver reduces the large phase variation associated with the received signal to eliminate the audio clicks.

14 Claims, 7 Drawing Sheets

FIG. 3
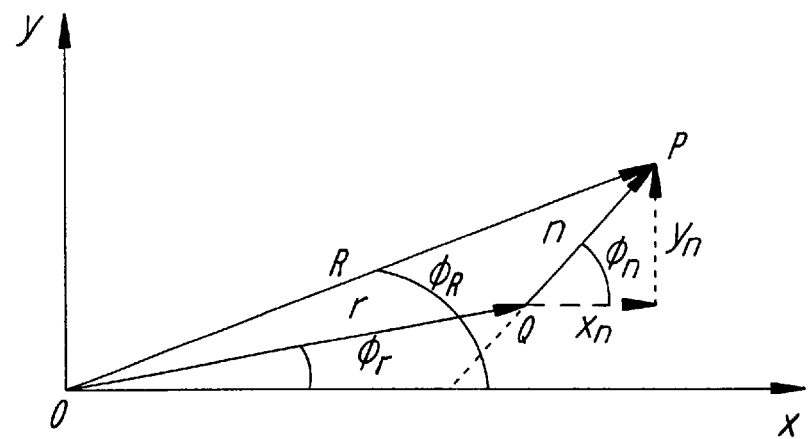
FIG. 4(a)
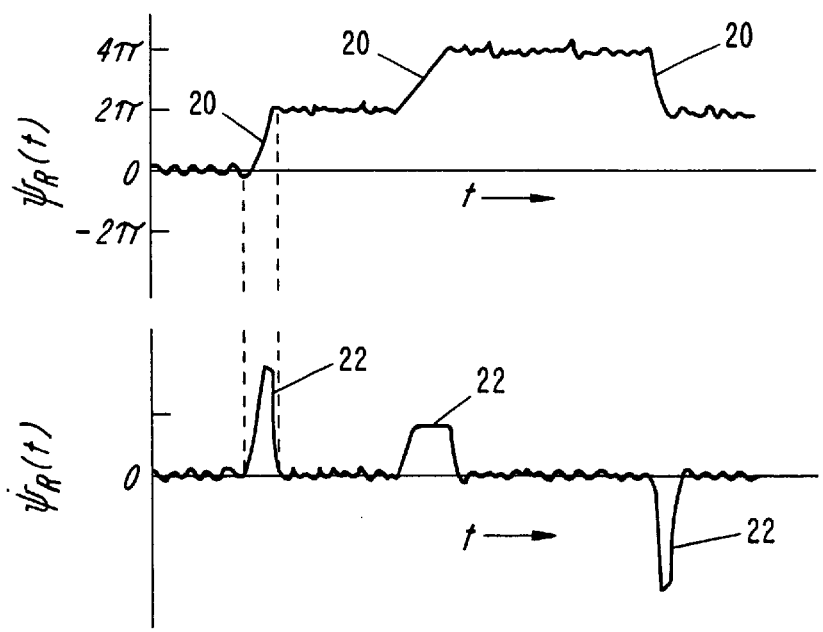
FIG. 4(b)

METHOD AND APPARATUS FOR ELIMINATING AUDIO CLICKS IN A RADIO RECEIVER

BACKGROUND OF THE INVENTION

This invention generally relates to the field of radio receivers and, more particularly, to enhancing the audio quality in the radio receivers.

Improving the audio quality is of paramount importance to manufacturers of communication devices, because audio quality is easily noticeable by users of the radio receivers. Among other things, degraded audio quality can result from various types of disturbances, which distort radio frequency (RF) signals. These disturbances include fading, interference, and noise. A fading condition occurs when a RF signal transmitted to the radio receiver propagates through multiple transmission paths on an RF channel. As a result, the received signal is received from different directions and fluctuates according to the propagation properties of the RF channel. A common example of fading occurs when the radio receiver along a road, while passing objects that reflect radio waves in many directions, for example, buildings or telephone poles, etc. Interference, which is also exposed to fading fluctuations, occurs when other transmitted signals interfere with the received signal at the radio receiver. Noise, which is caused by thermal conditions, has a constant spectral density. One or a combination of fading, interference, or noise can adversely influence the audio quality at the radio receiver.

When the number of propagation paths is large, the impulse response of the RF channel has a Rayleigh distribution pattern. Therefore, the received signal, which is known as Rayleigh-faded signal, fluctuates both in phase and amplitude. A destructive condition reduces the amplitude of the received signal into fading dips, and a constructive condition will increase the amplitude. During the fading dips, the magnitude of a faded received signal may become small enough to cause a substantial momentary decrease in the signal-to-noise ratio of the radio receiver. As a result, phase variations of the received signal generate repetitive and annoying audio disturbances, which are known as audio clicks. The severity of the audio clicks is proportional to the number of fading dips. As the number of fading dips increases, the audio quality at the receiver worsens. The extent of audio quality degradation, therefore, depends on how severe the multipath propagation is together with the average received signal strength and the interference and/or noise levels.

Various noise reduction techniques have been used to control noise bursts and to reduce the overall noise level in radio receivers. Such techniques include, for example, syllabic companding, high frequency equalization, automatic gain control (AGC) circuits, noise blankers, and space diversity receivers. However, these techniques are generally ineffective in reducing the audio disturbances associated with fading conditions.

Conventional methods generally rely on the received signal strength or discriminator noise levels at the radio receiver for reducing audio clicks caused by fading. According to one method, an analog FM receiver reduces noise bursts and audio clicks by selectively attenuating demodulated audio signals in response to a control signal derived from one or a combination of the discriminator noise or received signal strength. To reduce the audio clicks, the audio signals are attenuated when the control signal exceeds a threshold. In another method, the audio clicks are eliminated by limiting the gain of a front end RF amplifier through which the faded signals are received. However, received signal strength and discriminator noise are not accurate parameters for detecting fading conditions. This is because the received signal strength and discriminator noise may be influenced by factors not associated with fading. As such, these conventional methods do not accurately detect fading conditions. For example, the received signal strength may decrease because of a large distance between the radio receiver and transmitter. Under this scenario, the conventional methods that rely on the received signal strength and discriminator noise may unnecessarily attenuate the audio or receiver gain, when no fading condition is present.

With the advent of powerful signal processors, many of today's communication systems are becoming digital. In digital communication systems, analog audio signals are digitized and coded into digital audio data. The digital audio data are transmitted in bursts, with each burst consisting of a predefined number of data bits. Digital communication systems improve audio quality using various methods that conceal errors associated with digital audio processing. For example, one conventional audio processing method recovers missing audio data packets using a Low Delay Code Excited Linear Prediction (L-CELP) algorithm. Another audio processing method erases speech frames when an error in the coding of the digital audio data is encountered. Other methods conceal distorted audio by replacing it with an estimate of how the audio should look like at an instant in time. When processing the digital audio data, these audio processing techniques, however, do not take into account the fading conditions associated with the RF channel. As a result, these techniques do not detect and eliminate audio clicks associated with fading conditions. Therefore, there exists a need for a radio receiver that accurately detects and eliminates audio clicks associated with fading conditions.

SUMMARY OF THE INVENTION

The present invention that addresses this need is exemplified in a radio receiver that incorporates a method and apparatus for reducing audio clicks by accurately detecting fading conditions and reducing a faded signal's phase variations, which cause the audio clicks.

Briefly, a method or apparatus according to the invention receives a faded signal and determines Its phase variations during a predefined time interval. If the phase variations exceed a phase variation threshold, for example, $2\pi$ radian, the phase variations of the faded signal are reduced below a predefined level. According to one aspect of the invention, if the phase variations exceed the phase variation threshold, the strength of the faded signal is also determined as an additional factor for detecting fading conditions. Under this aspect, the phase variations of the faded signal are reduced below the predefined level only if the strength of the faded signal is below a signal strength threshold.

According to some of the more detailed features of the invention, the faded signal is processed to provide a complex baseband signal that includes inphase (I) and Quadrature (Q) components. The phase variations of the faded signal are determined based on the I and Q components of the baseband signal. In an exemplary embodiment, the phase variations of the faded signal are determined by sampling the complex baseband signal at a predefined sampling rate. Based on the sample's corresponding I and Q components, a phase difference corresponding to each one of two consecutive samples is determined by subtracting the samples' associated phases from each other. The phase differences of a predefined number of consecutive samples are summed to provide a phase variation associated with a baseband vector. The audio clicks are suppressed by reducing the phase variation of the baseband vector below the predefined level, if such phase variation exceeds the phase variation threshold. Preferably, the predefined level below which the phase variation is reduced is $2\pi$ radian. In an exemplary arrangement, the phase variation is reduced by dividing the phase associated with each sample by an integer, such as 2, 4, etc.

Other features and advantages of the present invention will become apparent from the following description of the preferred embodiment, taken in conjunction with the accompanying drawings.

BRIEF DESCRIPTION OF THE DRAWINGS

FIG. 3 is a phasor diagram of a signal received by the receiver of FIG. 1.

FIG. 4(a) is a diagram of exemplary phase variations of the received signal of FIG. 3 under fading conditions.

FIG. 4(b) is a diagram of the audio clicks produced by the phase variations of FIG. 4(a).

DETAILED DESCRIPTION

Figure 1:
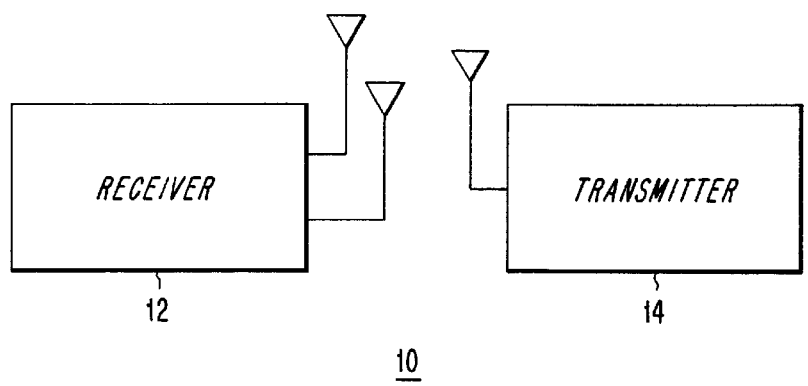
FIG. 1 is a diagram of a communication system that advantageously incorporates a receiver according to the present invention.

Referring to FIG. 1, a communication system 10 according to the present invention is shown to include a radio receiver 12 and a radio transmitter 14. The system 10 preferably operates based Advanced Mobile Phone System (AMPS) or Digital-AMPS (D-AMPS) standard. One such system is a base station known as CMS-88, which is offered by Telefonaktiebolaget L M Ericsson, the assignee of the present invention. The communication system 10 uses an RF channel in the 800 MHz band, which has a signal bandwidth of 30 KHz and channel bandwidth of 100 KHz.

Figure 2A:
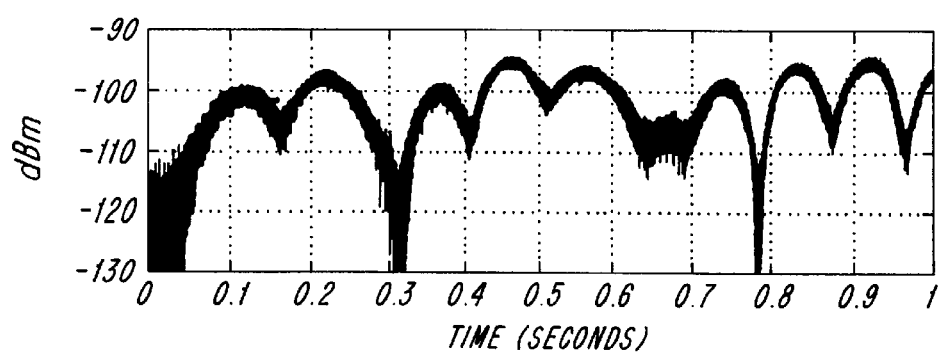
FIG. 2(a) is a diagram of the amplitude of a Rayleigh-faded signal.
Figure 2B:
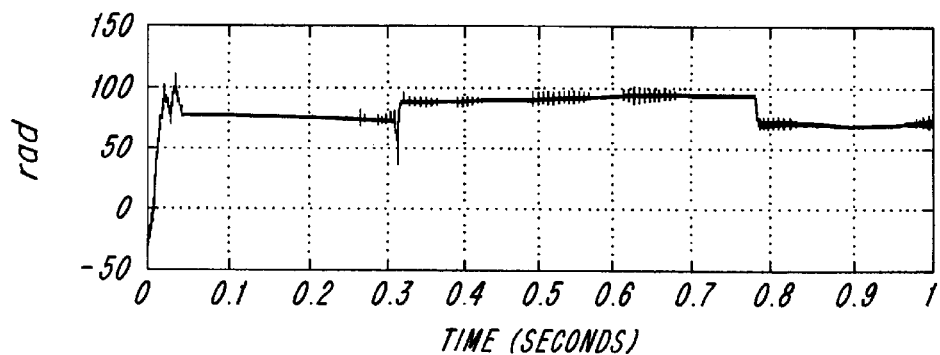
FIG. 2(b) is a diagram of the phase of the Rayleigh-faded signal of FIG. 2(a).

The communication system 10 communicates messages in bursts that contain a predefined number of digital data bits. As described later in detail, these bursts are produced at the transmitter 14 by up-converting digital audio data to produce In-phase (I) and Quadrature (Q) baseband signals. The I and Q baseband signals are frequency modulated on the RF channel for transmission through an antenna 16. Depending on the terrain, the transmitted radio frequency waves may be subject to fading conditions, caused by reflective objects within the wave's propagation path, as well as interference and noise conditions. The fading conditions change the amplitude and the phase of the received signal at the radio receiver 12. Therefore, the radio receiver 12 receives a faded signal, which has both amplitude and phase variations. Exemplary amplitude and phase variations of the faded signal are shown in FIGS. 2(a) and 2(b), respectively. The radio receiver 12 receives the faded signal via one or more antennas 18 and demodulates the signal, using intermediate frequency (IF) or direct (zero IF) down-conversion, to recover the baseband signal. As described later in detail, the preferred embodiment of the invention uses quadrature processing to recover a complex baseband signal that includes Inphase (I) and Quadrature (Q) components. The I and Q components are then processed digitally to retrieve the audio data transmitted from the transmitter 14.

It has been determined that certain large phase variations of the faded signal are the primary causes of the audio clicks. With reference to FIG. 3, the phasor diagram of the faded signal received at the receiver 12 is shown to include a vector r representing the magnitude and the phase $\phi_r$ of a faded signal received by the receiver under slow fading conditions. In FIG. 3, the noise is represented by a vector n having a phase $\phi_n$, which varies rapidly about a point Q at the tip of the faded signal vector r. Therefore, the phase variations of the faded signal vector r are at a much slower rate than phase variations associated with the noise vector n. The received signal is represented by a resultant vector R, which extends from an origin O. The received signal vector R has a phase $\phi_R$ that varies according to the phase and magnitude variations of the vectors r and n. When the faded signal magnitude is large, the rapid variations in the magnitude and phase of the noise vector n do not contribute to significant phase variations of the faded signal vector R. However, when the magnitude of the faded signal drops due to fading dips, the rapid phase variations of the noise vector n cause sudden and large phase variations in the received signal vector R. Therefore, the direction of the received signal vector R can suddenly rotate one or more times around the origin O to cause large phase variations that may be one or more multiples of $2\pi$ radian. FIG. 4(a) shows exemplary sudden phase variations 20 that may occur during fading conditions. FIG. 4(b) shows impulses 22 that are produced as a result of the sudden phase variations 20. Depending on the magnitude of the received signal and noise, the amplitude of the impulses 22 may vary. However, the corresponding impulse areas are substantially constant at +/−$2\pi$ radian. The impulses with wide durations, which are not filtered during demodulation process at the receiver, generate the annoying audio clicks heard at the radio receiver.

Accordingly, the present invention accurately detects audio clicks associated with fading conditions based on large phase variations of the received signal. According to the present invention, the phase variations of the received signal are determined. If the determined phase variations are above a predefined phase variation threshold, for example, $2\pi$ radian, the present invention reduces the phase variations below a predefined level, to eliminate the audio clicks. Preferably, the present invention reduces the phase variations when the received signals strength drops below a signal strength threshold. As such, unlike the conventional techniques that rely on parameters not directly associated with fading conditions, the present invention accurately detects the fading conditions and eliminates the resulting audio clicks.

Figure 5:
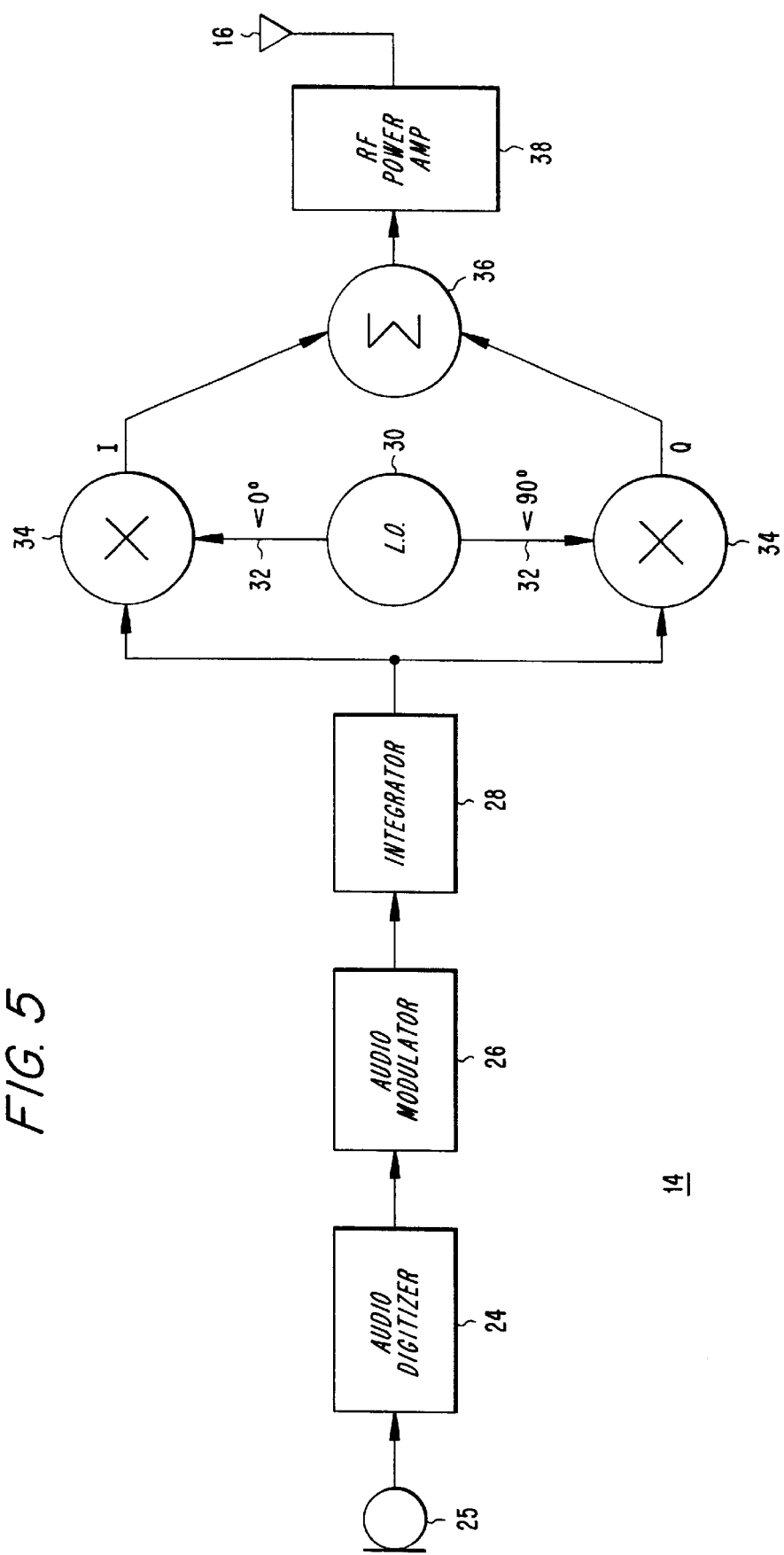
FIG. 5 is a block diagram of a transmitter of the communication system of FIG. 1.

With reference to FIG. 5, a block diagram of the transmitter 14 is shown. The transmitter 14 includes an audio digitizer block 24 that digitized an analog audio signal, provided, for example, from a microphone 25, at a predefined rate. An audio modulator block 26 modulates the digitized audio signal in a well known manner, by adding preemphasis, compression and PCM conversion. The audio modulated signal is integrated by an integrator block 28, to provide a signal representing the phase of the modulated signal. A complex (quadrature) local oscillator 30, operating at the carrier frequency of the RF channel, provides complex local oscillator signals on line 32 that are 90 degrees out of phase from each other. The output of the integrator block 28 and the complex local oscillators 30 are mixed through two up-mixers 34. The outputs of the mixers 34, which are the I and Q components of a complex transmitter baseband signal, are summed with each other through a summer 36. In this way, the transmitter 14 modulates the analog audio signal according to a frequency modulation (FM) technique. The output of the summer is amplified by an RF power amplifier 38 for transmission through the antenna 16.

Figure 6:
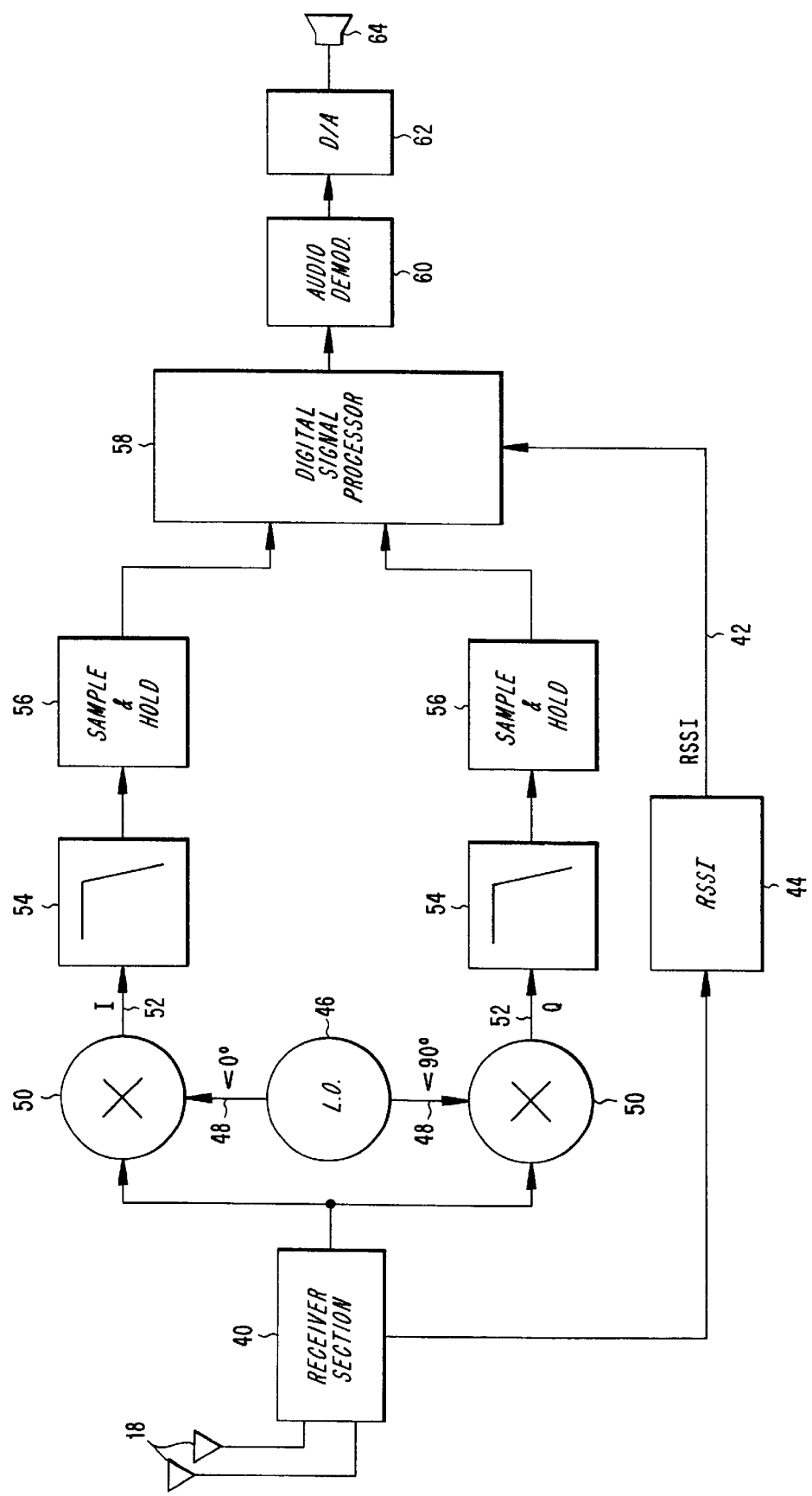
FIG. 6 is a block diagram of the receiver the incorporates the method and apparatus for reducing audio clicks according to the present invention.

With reference to FIG. 6, a block diagram of the radio receiver 12 is shown. The radio receiver may use either antenna diversity or no diversity for receiving the transmitted signals. The diversity is attained by receiving the received signal through two or more antennas 18. A receiver section 40, which provides receiver selectivity, combines the signals from the antennas 18. If diversity is used, the amplified received signals from the antennas 18 are combined, preferably using equal-gain diversity combination. Based on the strength of the received signal at the antennas 18, a received signal strength indicator (RSSI) block 44 provides an RSSI signal on line 42. Under equal-gain diversity, the RSSI signal may correspond to a maximum received signal strength at the antennas 18. Alternatively, the RSSI signal may correspond to the average of the received signals strength at the antennas 18. A complex local oscillator 46 generates 90 degrees out-of-phase local oscillator signals on lines 48 to down conversion mixers 50. The mixers 50 down convert the received signal, to generate a complex receiver baseband signal on lines 52 that has corresponding I and Q components. The I and Q components are filtered, by low pass filters 54, and are applied to sample and hold circuits 56 that sample corresponding I and Q components of the complex baseband signal at a predetermined rate. In an exemplary embodiment, the I and Q components are sampled at a rate of 240 kbits/s, comprising 80 kbits of audio data and 160 kbits of coded digital data. For each one of the I and Q components, a predefined number of samples are held in buffers (not shown), which are included in the sample and hold circuits 56.

Each set of the predefined number of samples are held as a baseband vector. Preferably, in the present invention, each one of the baseband vectors includes 120 samples. Accordingly, at a 240 kbits/s sampling rate, each baseband vector has a 0.5 ms duration. As described later in detail, a digital signal processor 58 processes the complex baseband signals and provides digital audio data that correspond to the transmitted audio signal. An audio demodulator block 60 audio demodulates the digital audio data in a well known manner, by deemphasising, decompressing and PCM decoding to retrieve a digitize representation of the transmitted analog audio signal. The output of the audio demodulator block 60 is applied to a digital to analog converter 62 that converts the digital audio data to an analog audio signal, which may be applied to an audio speaker 64 to create an audible sound.

The samples of the complex baseband signal, as represented by the I and Q components, are applied to the digital signal processor 58 for digital processing according to the present invention. For this reason, the I and Q components are converted into digital data bits that correspond to a set of digital I and Q signal value pairs. Each pair includes an I value and a corresponding Q value representing, respectively, the I and Q components in a particular bit period. In the receiver 12, the signal processor 58 processes the digital I and Q values of such signal-value pairs to analyze the received signal for the purpose of recovering the audio signal. In FM received signals, which have a constant amplitude, the signal-value pairs would lie on a common circle, if plotted on a complex signal space diagram (I-Q diagram). The angular position of the plotted signal-value pairs with respect to the center of the circle is used by the signal processor 58 to demodulate the baseband signal for recovering the digital audio. The signal processor also receives the RSSI signal provided by the RSSI block 44. As described later in detail, the signal processor 58 processes the baseband vectors and the RSSI signal to eliminate audio clicks.

Figure 7:
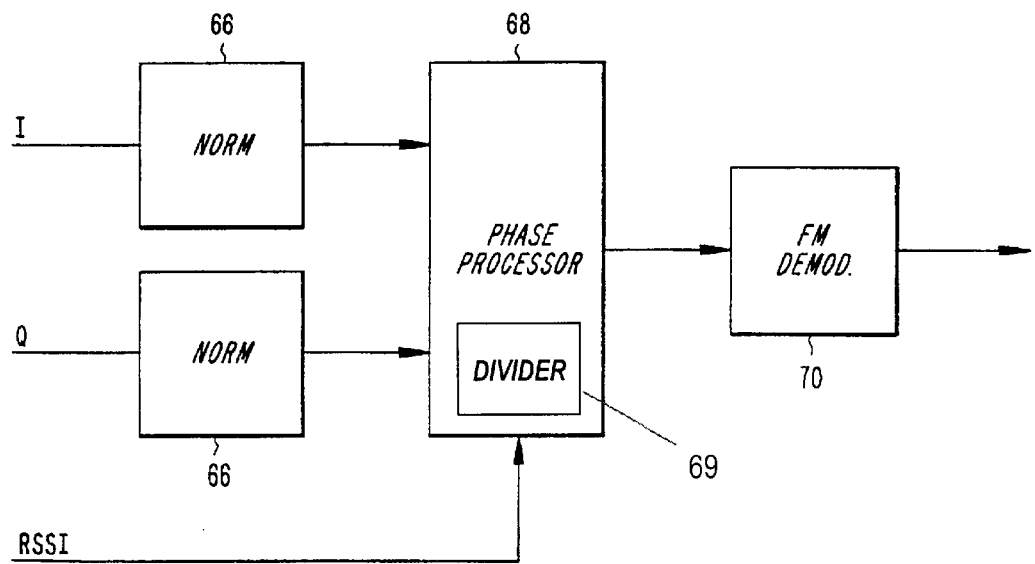
FIG. 7 is a block diagram of a digital signal processor incorporated in the receiver of FIG. 6.

Referring to FIG. 7, a block diagram of the processes performed by the digital signal processor 58 for processing the baseband vectors and the RSSI signal according to the present invention is shown. The I and Q values are normalized by normalizing blocks 66. A phase processor 68 processes the normalized I and Q values to determine the phase associated with each sample. The phase processor 68 determines the phase for each sample by taking the arc-tangent of the corresponding I and Q values. Under the FM modulation in the transmitter, the information representing the audio signal are contained in the phase differences of each two consecutive samples. Therefore, the phase processor 68 determines the phase differences of the consecutive samples contained in the baseband vector. The phase processor 68 continues this processes until the phase differences of each one of the two consecutive samples within the baseband vector are determined.

In order to determine a phase variation associated with a baseband vector, the phase processor sums the phase differences of the consecutive samples. In this way, the phase processor can determine whether the phase variations associated with each baseband vector are above or below the phase variation threshold. If the phase variations associated with a baseband vector are greater than the phase variation threshold, the phase processor reduces the phase variation until it drops below a predefined level. In the preferred embodiment, when phase variations of larger than $2\pi$ radian are detected, the phase processor 68 reduces the phase variation until they drop below a predefined level. The phase processor 68 reduces the phase variations using a variety of techniques. For example, all the phases associated with the samples of the vector may be divided by a predefined integer to reduce the phase variations. Alternatively, a predefined amount may be subtracted from each phase associated with the vector samples. In an exemplary embodiment, the phase processor 68 iteratively reduces the phase variation associated with the baseband vector by dividing each phase of the samples by an integer 4. The division process continues until the phase variation drops below the predefined level of $2\pi$ radian. In some embodiments, this division process may be accomplished with the use of a divider 69. The phase processor 68 provides the phase differences associated with samples of the baseband vector to an FM demodulator 70 that processes the differences to provide the digital audio data.

Preferably, in order to detect phase variations that are marginally greater than the phase variation threshold, the phase processor uses the phase differences associated with certain number of the last samples in each baseband vector, for example, the last 24 samples, when calculating the phase variations associated with a subsequent baseband vector. Under this arrangement, the present invention buffers the phase differences associated with the last samples of each baseband vector and adds them to the summation of the phase differences associated with the subsequent baseband vector. In this way, the determination of the phase variation associated with each baseband vector also takes into account the phase differences of preceding baseband vector, for detecting marginally large phase variations.

As previously discussed, not all large phase variations are associated with fading dips. Thus, according to one aspect of the present invention, a fading dip probability of the received signal is also determined before eliminating the audio clicks. In the preferred embodiment, the present invention uses the received signal strength associated with the baseband vectors for determining the fading dip probability, which is expressed in percentage. Accordingly, when the received signal strength, as represented by the RSSI signal, indicates a high fading dip probability, the present invention reduces the phase variations associated with the baseband vectors. In one embodiment, the fading dip probability is calculated based on the amount of time during which the received signal strength remains above a signal strength threshold. More specifically, if the received signal strength associated with a predefined number of samples within the baseband vector is below the signal strength threshold, the large phase variations are reduced. For example, with no diversity, the invention would reduce phase variations of greater than $2\pi$ radian, if the received signal strength associated with 6 samples of a baseband vector are below $-120$ dBm. The low signal strength associated with 6 samples of the 120 sample baseband vector corresponds to a fading dip probability of 5 percent.

Figure 8:
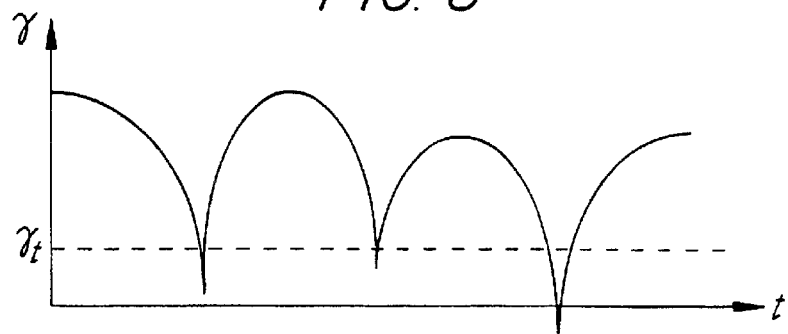
FIG. 8 is a diagram of a rayleigh-faded signal relative to a noise threshold.

Alternatively, in another embodiment, the fading dip probability may be expressed in terms of outage probability. The outage probability is determined by taking into account the received signal strength and a fade margin associated with a communication field. The fade margin, which is expressed in dB, corresponds to a transmitted power margin that guarantees a sufficient received signal strength, even when the strength of the received signal is at a minimum. According to this embodiment, when the outage probability goes above a predefined level, the present invention reduces the large phase variations of the received signal. Referring to FIG. 8, a simplified diagram of a Rayleigh-faded received signal is shown to have a density function expressed by Equation (1):

$$p(\gamma) = \left(\frac{1}{\gamma_0}\right) e^{\frac{\gamma}{\gamma_o}} \qquad (1)$$

where $\gamma_o$ corresponds to the average received signal strength. When no diversity is used, the level of thermal noise and interference threshold, which is represented by the $\gamma_t$ lies at about $-121$ dBm level. Whereas, with equal-gain diversity, the noise level is at about $-118$ dBm. The amount of time during which the received signal stays above the threshold $\gamma_t$ is known as availability. The availability is expressed by Equation (2):

$$1 - Pr\left(\frac{\gamma_o}{k_f}\right) \qquad (2)$$

where $k_f$ is the fading margin, which corresponds to the ratio of the received signal strength $\gamma$ to the average received signal strength $\gamma_o$ ($\gamma/\gamma_o$). The outage probability is expressed by Equation (3):

$$P_{out} = Pr\{\Gamma < \gamma_t\} = \left(1 - e^{-\frac{1}{K_f}}\right) \qquad (3)$$

Figure 9:
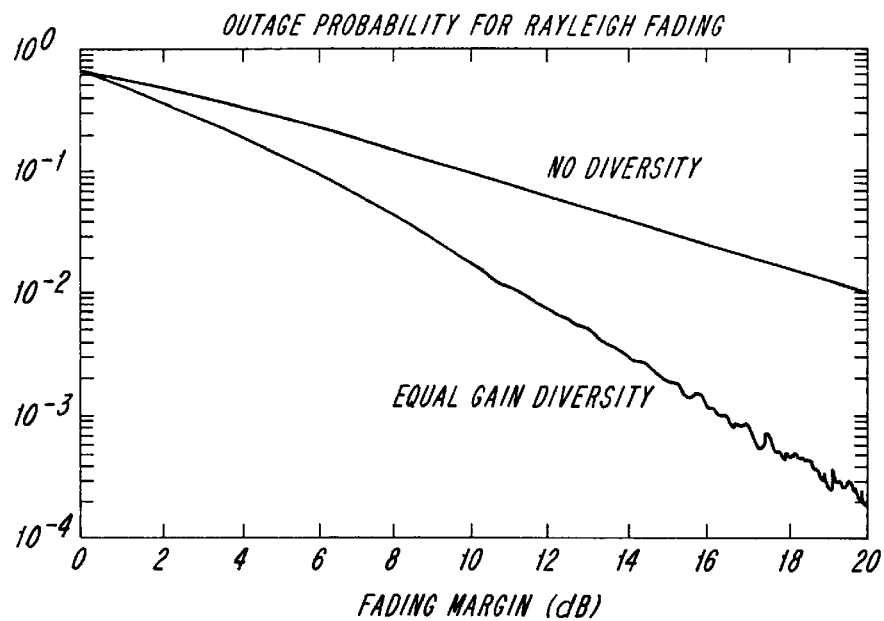
FIG. 9 is a diagram of outage probability as a function of fade margin.

Under this embodiment, the outage probability is determined based on the RSSI signal using Equation (3). As the fade margin increases, the outage probability decreases. According to an exemplary embodiment, the phase processor reduces the phase variations of greater than 27 radian, when the outage probability is greater than 5 percent. FIG. 9 shows the outage probability as a function of fade margin, for both non-diversity and equal-gain diversity conditions. According to FIG. 9, a five percent outage probability theoretically corresponds to a fade margin of around 8 dB for the non-diversity and 15 dB for diversity reception.

Figure 10:
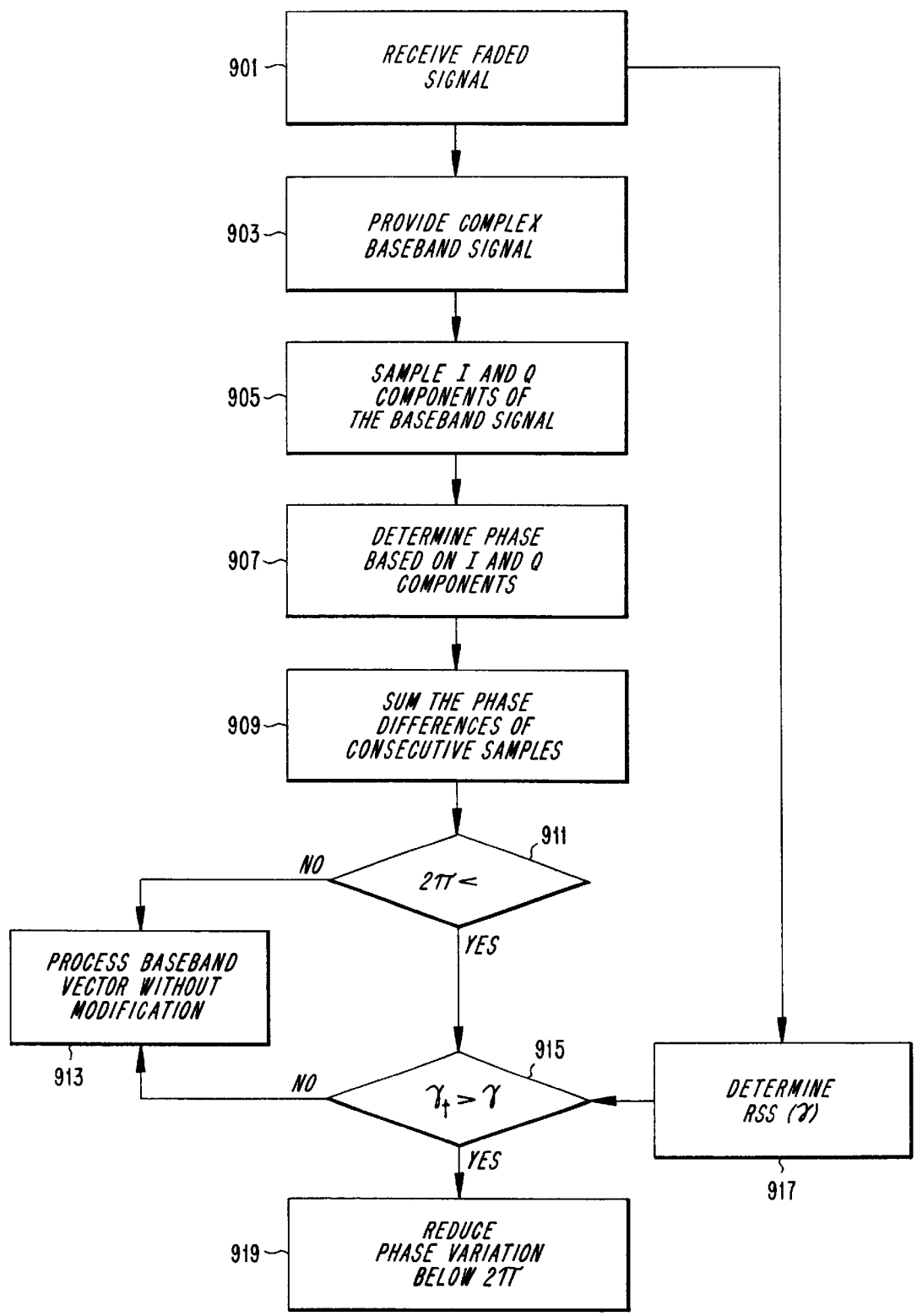
FIG. 10 is a flow chart of a method for reducing the audio clicks according to the present invention.

With reference to FIG. 10, a flow chart of the steps taken according to the present invention for eliminating audio clicks under fading conditions is shown. In block 901, a receiver according to the present invention receives a faded signal. The faded signal is processed to provide a complex baseband signal that includes I and Q components, block 903. The I and Q components are sampled at a predefined sampling rate, block 905. The phase associated with each sample is determined based on its corresponding I and Q components, block 907. Then, a phase difference between each two consecutive samples is determined. The phase differences of a predefined number of consecutive samples are summed together to provide a phase variation associated with a baseband vector, block 909. Then, a determination is made as to whether the phase variation of the baseband vector is greater than the phase variation threshold, block 911. If not greater, the baseband vector is processed without modification to recover the digital audio data, block 913. If greater, a determination is made as to whether the strength associated with at least one of the samples within the baseband vector is below the signal strength threshold, block 915. The signal strength is determined based on the received faded signal, block 917. If not below, the baseband vector is processed without modification to recover the digital audio data, block 913. Otherwise, the phase variation associated with the baseband vector is reduced below a predefined phase variation level, block 919.

Figure 11A:
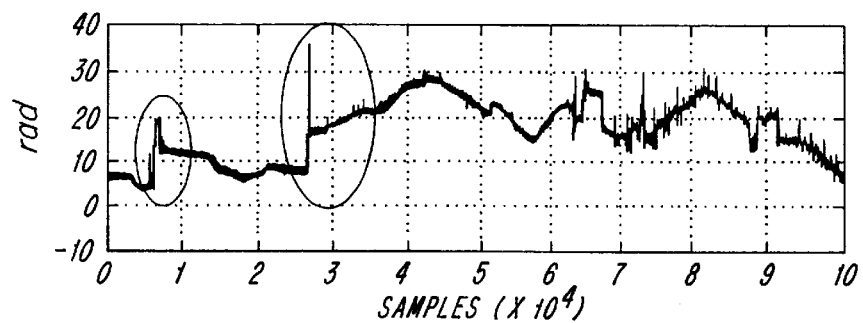
FIGS. 11(a) and 11(b) are comparison of phase variations of a baseband signal before and after the method and apparatus according to the present invention is implemented, respectively.
Figure 11B:
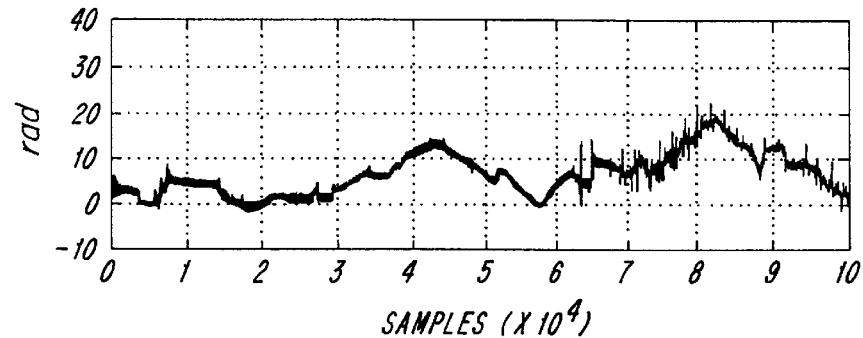

FIGS. 11(a) and 11(b) are shown for comparison of the phase variations associated with samples before and after the present invention is implemented. FIG. 11(a) shows, in circles, some of the sudden large phase variations associated with the samples, when the samples are not processed according to the present invention. FIG. 11(b) show that the sudden phase variations associated with the samples are suppressed by processing the samples according to the present invention, thereby eliminating the audio clicks.

From the foregoing description, it will be appreciated that unlike conventional techniques the present invention improves audio quality by accurately detecting the fading conditions. As described above, the present invention detects the fading conditions based on large phase variations of the received signals. In this way, the present invention eliminates the undesired audio clicks under fading condition only when it is necessary, and avoids manipulating the received signal unnecessarily.

Although the invention has been described in detail with reference only to a preferred embodiment, those skilled in the art will appreciate that various modifications can be made without departing from the invention. Accordingly, the invention is defined only by the following claims which are intended to embrace all equivalents thereof.

What is claimed is:

1. An apparatus for reducing audio clicks under fading conditions, comprising:
   means for receiving a faded signal;
   means for determining phase variations of the faded signal using the phase differences between each two consecutive samples wherein the means for determining the phase variations include:
      means for processing the faded signal to provide a complex baseband signal that includes inphase (I) and quadrature (Q) components, and
      means for determining the phase variations of the faded signal based on the I and Q components of the complex baseband signal;
   means for reducing the phase variations below a predefined level, if the phase variations exceed a phase variation threshold, wherein the phase variation threshold is greater than $2\pi$ radian; and
   means for determining the strength of the faded signal, if the phase variations of the faded signal exceed the phase variation threshold, wherein the phase variations of the faded signal are reduced below the predefined level, only if the strength of the faded signal is below a signal strength threshold,
   wherein the means for processing the faded signal include:
   means for sampling the complex baseband signal at a predefined sampling rate;
   means for determining the phase associated with each sample based on the sample's corresponding I and Q components;
   means for determining the phase differences between each two consecutive samples; and
   means for summing the phase differences of a predefined number of consecutive samples to provide a phase variation associated with a baseband vector.

2. The apparatus of claim 1, wherein the means for reducing the phase variations reduces the phase variation associated with the baseband vector below the predefined level, if such phase variation exceeds $2\pi$ radian.

3. The apparatus of claim 2, wherein the predefined level below which the phase variation is reduced is $2\pi$ radian.

4. The apparatus of claim 2, wherein the means for reducing the phase variations includes a divider for dividing the phase associated with each sample by an integer.

5. The apparatus of claim 4, wherein the integer is equal to four.

6. A method for reducing audio clicks under fading conditions, comprising the steps of:
   (a) receiving a faded signal;
   (b) determining whether phase variations of the faded signal exceed a phase variation threshold using the phase differences between each two consecutive samples wherein step (b) includes the steps of:
      (b)(1) processing the faded signal to provide a complex baseband signal that includes inphase (I) and quadrature (Q) components; and
      (b)(2) determining the phase variations of the faded signal based on the I and Q components of the complex baseband signal;
   (c) if so, reducing the phase variations of the faded signal below a predefined level, wherein the chase variation threshold is greater than $2\pi$ radian, and
   (d) determining the strength of the faded signal, if the phase variations of the faded signal exceeds the phase variation threshold, wherein the phase variations of the faded signal are reduced below the predefined level, only if the strength of the faded signal is below a signal strength threshold;
   wherein step (b)(1) includes the steps of:
   sampling the complex baseband signal at a predefined sampling rate;
   determining the phase associated with each sample based on its corresponding I and Q components;
   determining the phase differences between each two consecutive samples; and
   summing the phase differences of a predefined number of consecutive samples to provide a phase variation associated with a baseband vector.

7. The method of claim 6, wherein step (c) reducing the phase variations reduces the phase variation associated with the baseband vector below the predefined level, if such phase variation exceeds $2\pi$ radian.

8. The method of claim 7, wherein the predefined level below which the phase variation is reduced is $2\pi$ radian.

9. The method of claim 7, wherein the step of reducing the phase variations includes dividing the phase associated with each sample by an integer.

10. The method of claim 7, wherein the integer is equal to four.

11. An apparatus for reducing audio clicks under fading conditions, comprising:
    means for receiving a faded signal;
    means for processing the faded signal to provide a complex baseband signal that includes inphase (I) and quadrature (Q) components;
    means for sampling the I and Q components at a predefined sampling rate;
    means for determining a phase associated with each sample based on the sample's corresponding I and Q components;
    means for determining phase differences between each two consecutive samples;
    means for summing the phase differences of a predefined number of consecutive samples to provide a phase variation associated with a baseband vector;
    means for determining whether the phase variation associated with the baseband vector is greater than a phase variation threshold;
    a means for determining whether a strength associated with at least one of the samples within the baseband vector is below a signal strength threshold; and
    means for reducing the phase variation associated with the baseband vector below a predefined phase variation level, if the strength associated with the at least one sample is below the signal strength threshold and if the phase variation associated with the baseband vector is greater than the phase variation threshold.

12. The apparatus of claim 11, wherein the phase variation threshold is greater than 2π radian.

13. A method for reducing audio clicks under fading conditions, comprising:

receiving a faded signal;

processing the faded signal to provide a complex baseband signal that includes inphase (I) and quadrature (Q) components;

sampling the I and Q components at a predefined sampling rate;

determining a phase associated with each sample based on the sample's corresponding I and Q components;

determining a phase difference between each two consecutive samples;

summing the phase differences of a predefined number of consecutive samples to provide a phase variation associated with a baseband vector;

determining whether the phase variation associated with the baseband vector is greater than a phase variation threshold;

determining whether a strength associated with at least one of the samples within the baseband vector is below a signal strength threshold; and reducing the phase variation associated with the baseband vector below a predefined phase variation level, if the strength associated with the at least one of sample is below the signal strength threshold and if the phase variation associated with the baseband vector is greater than the phase variation threshold.

14. The method of claim 13, wherein the phase variation threshold is greater than 2π radian.

* * * * *